United States Patent
Leobandung et al.

(10) Patent No.: US 9,502,506 B2
(45) Date of Patent: Nov. 22, 2016

(54) STRUCTURE FOR FINFET FINS

(71) Applicant: International Business Machines Corporation, Armonk, NY (US)

(72) Inventors: Effendi Leobandung, Stormville, NY (US); Tenko Yamashita, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/159,845

(22) Filed: May 20, 2016

(65) Prior Publication Data

US 2016/0315147 A1  Oct. 27, 2016

Related U.S. Application Data (62) Division of application No. 14/691,645, filed on Apr. 21, 2015, now Pat. No. 9,391,074.

(51) Int. Cl.
| | | |
|---|---|---|
| H01L 21/8234 | (2006.01) | |
| H01L 27/088 | (2006.01) | |
| H01L 29/10 | (2006.01) | |
| H01L 27/02 | (2006.01) | |
| H01L 29/78 | (2006.01) | |

(52) U.S. Cl.
CPC ....... H01L 29/1037 (2013.01); H01L 27/0207 (2013.01); H01L 29/7851 (2013.01); *H01L 21/823431* (2013.01); *H01L 27/0886* (2013.01)

(58) Field of Classification Search
CPC ............. H01L 21/823431; H01L 27/0886
USPC ....................................................... 257/401
See application file for complete search history.

(56) References Cited

U.S. PATENT DOCUMENTS

| | | | |
|---|---|---|---|
| 6,921,963 B2 | 7/2005 | Krivokapic et al. | |
| 8,003,466 B2 | 8/2011 | Shi et al. | |
| 8,569,152 B1 | 10/2013 | Basker et al. | |
| 8,592,290 B1 | 11/2013 | Basker et al. | |
| 9,318,342 B2* | 4/2016 | Xie | H01L 29/0692 |
| 9,385,189 B1* | 7/2016 | Sung | H01L 29/0638 |
| 2012/0086055 A1 | 4/2012 | Anderson et al. | |
| 2013/0210232 A1 | 8/2013 | De et al. | |
| 2014/0138797 A1 | 5/2014 | Cheng et al. | |

(Continued)

OTHER PUBLICATIONS

Biermann et al., "Oxide Growth Enhancement on Highly n-Type Doped Silicon under Steam Oxidation," Journal of The Electrochemical Society, Apr. 1996, vol. 143, No. 4, pp. 1434-1442, © 1996 ECS—The Electrochemical Society, Inc.

(Continued)

*Primary Examiner* — George Fourson, III
(74) *Attorney, Agent, or Firm* — Nicholas D. Bowman (57) ABSTRACT

A design structure for fins in a fin array that can be included in a fin field effect transistor (FinFET), the design structure including: a semiconductor fin being on a substrate and having a semiconductor fin height and a first side; a dielectric fin having a dielectric fin height and a second side facing the first side, the dielectric fin extending in a first direction substantially parallel to the first semiconductor fin; a first conformal liner lining a first trough, the first conformal liner extending across the substrate between the first side and the second side and up to approximately the dielectric fin height on the first side and on the second side; and a fill material filling the first trough to approximately the dielectric fin height.

6 Claims, 7 Drawing Sheets

(56) References Cited

U.S. PATENT DOCUMENTS

| | | | |
|---|---|---|---|
| 2014/0159171 A1* | 6/2014 | Cai | H01L 29/785 257/412 |
| 2014/0227857 A1* | 8/2014 | Youn | H01L 21/76229 438/427 |
| 2014/0346574 A1* | 11/2014 | Cai | H01L 29/66795 257/288 |
| 2014/0367795 A1* | 12/2014 | Cai | H01L 27/0886 257/392 |
| 2015/0214341 A1* | 7/2015 | Shin | H01L 29/66818 257/401 |
| 2015/0249155 A1* | 9/2015 | Xu | H01L 21/02164 257/347 |
| 2015/0357470 A1 | 12/2015 | Cheng et al. | |
| 2016/0056293 A1 | 2/2016 | Yeh et al. | |
| 2016/0197079 A1* | 7/2016 | Lin | H01L 27/0924 257/369 |

OTHER PUBLICATIONS

Leobandung et al., "Design Structure for FinFET Fins", U.S. Appl. No. 14/691,645, filed Apr. 21, 2015.

List of IBM Patents or Patent Applications Treated as Related, May 18, 2016, 2 pages.

\* cited by examiner

STRUCTURE FOR FINFET FINS

BACKGROUND

The present disclosure relates to a design structure for a fin field effect transistor (FinFET) and to a method for making FinFETs in an integrated circuit. More particularly, the present disclosure relates to a method of cutting fins from an array of fins during the process of making a FinFET. Under some circumstances it can be desirable to create large areas with regularly-spaced fins that will become part of FinFETs in an integrated circuit. The fins in the large areas (fin arrays) can be cut in order to break long fins in to smaller fins or fin segments that can later be incorporated into FinFETs.

SUMMARY

Certain embodiments of the present disclosure may be directed toward a design structure for fins in a fin array that can be included in a fin field effect transistor (FinFET), the design structure including: a semiconductor fin being on a substrate and having a semiconductor fin height and a first side; a dielectric fin having a dielectric fin height and a second side facing the first side, the dielectric fin extending in a first direction substantially parallel to the first semiconductor fin; a first conformal liner lining a first trough, the first conformal liner extending across the substrate between the first side and the second side and up to approximately the dielectric fin height on the first side and on the second side; and a fill material filling the first trough to approximately the dielectric fin height.

Various embodiments of the present disclosure can be related to methods of cutting fins from a fin array on a substrate. The method can include: depositing a conformal liner on a plurality of semiconductor fins on the substrate; depositing a fill material into a plurality of troughs between the plurality of semiconductor fins; exposing the top side of at least one target fin; and implanting a dopant into each exposed target fin. The method can also include oxidizing each implanted target fin; recessing each oxidized target fin to a first height; recessing the fill material to approximately the first height; and removing an exposed portion of the conformal liner above the first height.

Some embodiments can be directed toward a semiconductor device comprising: a fin array on a substrate and having a first semiconductor fin with a semiconductor fin height and a first side; and a dielectric fin with a dielectric fin height and a second side facing the first side, the dielectric fin extending in a first direction substantially parallel to the semiconductor fin. The semiconductor device may further comprise a conformal liner lining a first trough, where the conformal liner extends across a substrate between the first side and the second side, and up to approximately the dielectric fin height on the first side and on the second side; and a fill material filling the first trough up to approximately the dielectric fin height.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to methods of semiconductor manufacturing, and more particular aspects relate to methods of thinning and cutting fins from among arrays of fins on a substrate in order to prepare them for inclusion in FinFETs in an integrated circuit. The process of forming FinFETs may be performed by producing large numbers of fins for inclusion in FinFETs. Forming large numbers of fins at once can simplify the manufacturing process and can result in FinFETs with more uniform fins. While the present disclosure is not necessarily limited to such applications, various aspects of the disclosure may be appreciated through a discussion of various examples using this context.

During semiconductor manufacturing, fin field effect transistors (FinFETs) may be formed out of a large fin array on a semiconductor substrate. A fin array can include many parallel fins from a layer of fin material in a single step before subsequent processing divides (cuts) the fins into groups or sections. Rather than cutting target fins and target fin segments (hereinafter, target fins) by etching them away, one may cut fins by oxidizing the fin material of the target fins and converting the target fins into non-conductive dielectric fins. Cutting target fins can eliminate a conductive top part of the target fin (some of the fin, or all of the fin) so that no semiconducting part of the target fin can connect with the FinFET gate when the FinFET is complete.

Fins in a fin array can have one or more fin lengths and fin widths, and a variety of fin pitches, as well. Across a single semiconductor wafer, fins with various lengths, widths, and pitches can be processed (cut) simultaneously during a fin cut process, or can be cut in sequential steps according to embodiments of integrated circuit manufacturing flows. Groups and sections of fins left behind after cutting can be incorporated into FinFETs according to integrated circuit designs. The process of cutting target fins may be performed to remove long segments of some fins, or to transect shorter segments across a number of other adjacent fins, in order to achieve the desired final fin layout for the integrated circuit. According to embodiments, fin arrays with a fin pitch of 40 nm or less between fins can undergo fin cutting by oxidizing semiconductor fins to create FinFETs. Some embodiments may have a fin pitch of approximately 20 nm between fins that are cut from a fin array. Embodiments with narrow fins can have fin pitches as small as 10 nm, according to aspects of the present disclosure.

Creating fins in a fin array can include steps of depositing a first hardmask made of an oxide such as silicon dioxide or a nitride such as silicon nitride on a layer of fin material, creating a fin pattern in the first hardmask, and etching the layer of fin material in order to expose the substrate beneath the fins. Fin materials can include silicon, doped silicon, silicon germanium alloys, and doped silicon germanium alloys, as well as other materials that can be formed into field effect transistors.

Embodiments of the present disclosure can include methods that leave the first hardmask on top of the semiconductor fins in the fin array after the fins are etched and before a conformal liner is deposited on top of the semiconductor fins. Some embodiments can include methods that remove the first hardmask before the conformal liner is deposited onto the semiconductor fins. The first hardmask is generally a sacrificial material in the film stack, removed before gate material is deposited onto the semiconductor fins. Embodiments of the present disclosure may describe processing the wafer with and without the first hardmask present. Such discussions should not be construed as limiting the scope of the present disclosure.

The semiconductor fins in the fin array can be cut in order to eliminate some fins (or parts of some fins) to leave a pattern of active fins behind. Active fins generally protrude above the top of a fill material deposited into troughs between fins in the fin array. Cutting target fins in a fin array, such that no part of a target fin protrudes above the top of the fill material in the troughs, can include oxidizing target fins in situ rather than physically removing target fin material by etching.

Oxidizing target fins can include oxidizing a top portion of a target fin, or can include oxidizing all of a target fin, according to embodiments. By converting the material of target fins into a nonconductive dielectric material, any semiconducting portion of a target fin can be encapsulated by the fill material deposited between fins and by the dielectric material (dielectric fin) that may remain on top of any semiconducting portion of a target fin. Further, by converting target semiconductor fins into dielectric fins or dielectric material, it is possible to reduce the height of the oxidized target fins through a chemical etching process rather than a plasma etching process if so desired. Cutting semiconductor fins by plasma etching can modify the slope of fin sides adjacent to the target fins, influencing their electrical properties. In some embodiments, wet chemical etching can be more uniform and more selective between materials than plasma etching, preserving fin material and fin profile during the cutting process.

Target fins to be cut during a cutting process may be cut through open areas in a second hardmask such as a silicon nitride hardmask. The open areas in a second hardmask can correspond to fin cut areas in a fin cut pattern for an integrated circuit. Second hardmask openings may extend in a first direction, parallel to the direction in which the fins run in the fin area, and in a second direction perpendicular to the first direction.

Figure 1:
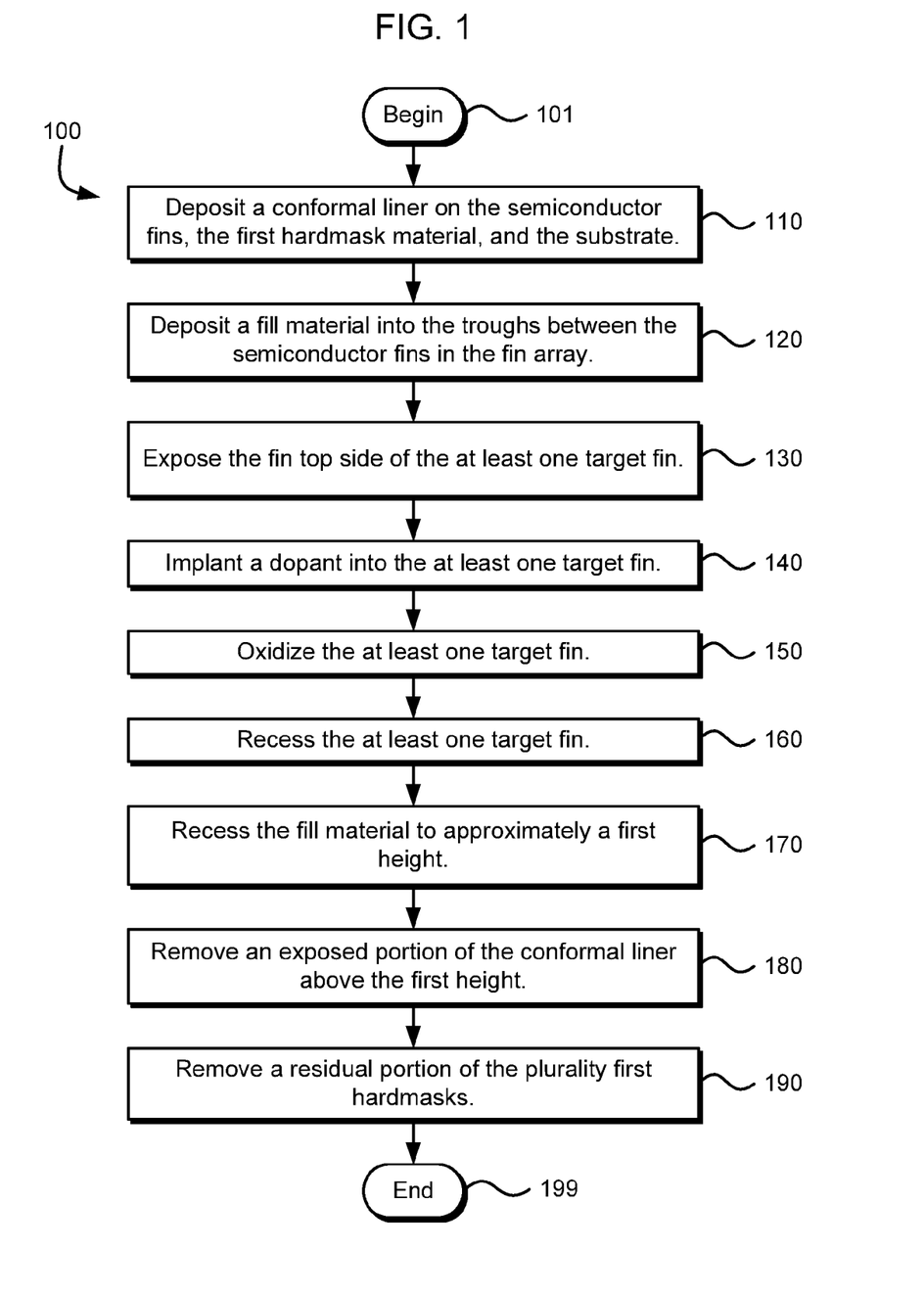
FIG. 1 describes a method of cutting a target fin from a fin array, according to embodiments.

FIG. 1 describes a method 100 of cutting a target fin from a fin array, according to embodiments. The method begins in block 101. Prior to beginning the method, a fin array containing a plurality of semiconductor fins may be created, each semiconductor fin standing on a substrate and having a first hardmask on a fin top side. A plurality of troughs can be between the semiconductor fins, revealing the substrate between the semiconductor fins. The method 100 may include depositing a conformal liner on the substrate, on the semiconductor fins, and on the first hardmask, as described in block 110. The conformal liner may be a nitride such as silicon nitride or an oxide, or may be made of some other liner material compatible with silicon or silicon germanium fins. The conformal liner can overlay, in a generally uniform layer, the substrate, fins, and first hardmask (if present on the fin top side). The conformal liner can protect the plurality of first hardmasks, the substrate, and the plurality of semiconductor fins from, e.g., chemical exposure, plasma etching, or ion bombardment that may occur in subsequent processing steps.

The method can also include depositing a fill material into the plurality of troughs between the semiconductor fins in the fin array, as described in block 120. The fill material may be an oxide such as silicon dioxide, according to some embodiments. The fill material may have a fill material top side that is approximately the same height as the semiconductor fins in the fin array. According to embodiments, the fill material may be deposited to a thickness greater than the height of the fins and then be polished/planarized in order to reduce the fill material thickness and to expose the conformal liner on top of the first hardmask on top of a target fin.

The method can include exposing a fin top side on top of a target fin that is to be oxidized, as shown in block 130. Exposing a fin top side can include several steps as described hereinafter. Exposing can begin with depositing a second hardmask layer on top of the fill material top side and on the conformal liner. The second hardmask layer may be made of silicon nitride or some other hardmask material compatible with cutting the target fins. Exposing a fin top side can include creating a pattern in the second hardmask layer by etching the fin cut areas in the fin cut pattern into the second hardmask layer. Each fin cut area in the fin cut pattern can be transferred into the second hardmask at a point over the target fins that are to be cut from the array of semiconductor fins.

After the fin cut pattern has been etched into the second hardmask, an upper portion of the conformal liner layer within each of the fin cut areas can be accessed. As part of exposing a fin top side, an upper portion of the conformal liner can be etched away using a plasma etch or a wet chemical etch process. In some embodiments, the upper portion of the conformal liner can include a flat portion of the top of a fin or hardmask. In embodiments with a hardmask on the fin top side, the upper portion of the conformal liner can also include conformal liner material between the hardmask and the fill material. In some embodiments, the upper portion may include conformal liner material on both the top side and the sides of the hardmask on the target fin. Exposing the fin top side can also include an etching step where the first hardmask on top of each of the target fins is etched away to expose the fin top side on each target fin.

The method may continue with a step wherein a dopant is implanted into target fins, as described in block 140. The dopant may be phosphorus, arsenic, or any dopant that promotes oxidation of the semiconductor fin material. The dopant may be implanted downward from the fin top side toward the substrate into the target fins through the second hardmask openings that correspond to the fin cut pattern. According to some embodiments, the implanting may proceed until dopant has been implanted through a top region of each target fin. The implantation may proceed to a depth of between 70 nanometers (nm) and 100 nm into a target fin in some embodiments. Some embodiments may be implanted until the dopant reaches the substrate. A relevant factor regarding dopant implantation is that the implant depth into the target fin be sufficiently deep that, after oxidizing a target fin into a dielectric fin, no unoxidized semiconductor fin material protrude above the final height of fill material (a first height) within the troughs. The implantation direction of the dopant may be perpendicular to the fin top side, or very nearly perpendicular to the fin top side, in order facilitate deep implantation of dopant while reducing the risk of dopant penetrating the conformal liner or the fill material to reach a semiconductor fin that is not a target fin.

The method may include oxidizing target fins that have been implanted with dopant, as described in block 150. Oxidizing may be accomplished by performing a steam oxidizing step wherein the wafer is exposed to an oxygen-containing gas. The oxygen-containing gas may be water vapor, or may be molecular oxygen. The exposure to oxygen-containing gas may be performed at elevated temperatures (between 600 degrees Celsius and 1000 degrees Celsius) for up to an hour in a furnace such as a rapid thermal processing (RTP) furnace. The dopant in implanted target fins can promote oxidation of the target fins beyond the amount of native oxide that might form on the fin top side. The dopant may create channels through the semiconductor material of the implanted target fin to allow water and oxygen to physically penetrate the structure of target fins. The dopant can also promote chemical reactions between the fin material in the target fins and the water and oxygen that create dielectric fins (oxidized target fins) out of the implanted target fins.

After oxidizing the target fins, the method can involve recessing the target fins (oxidized target fins, or dielectric fins) to a first height above the substrate, as described in block 160. Oxidized target fins can be recessed by wet chemical etching or plasma etching, and can remove the top part of the dielectric formed by the oxidation process. The method may also involve recessing the fill material to approximately the first height, as described in block 170. Recessing the fill material can be preceded in some embodiments by removing the second hardmask to expose fill material previously hidden by the second hardmask (such as fill material between adjacent fins that are not target fins). Recessing the fill material and target fins after the oxidation step can create a smooth surface onto which other materials such as spacers on semiconductor fins, additional layers of fill material, semiconductor gate materials, and so forth, can be deposited.

In embodiments where the processes used to recess the fill material and the target fins do not simultaneously etch the conformal liner material, there may be a fence of liner material that protrudes above the first height between regions of fill material and target fins. Further, some conformal liner material may cover the semiconductor fins and any hardmask on the semiconductor fins. The method 100 can involve removing the exposed portion of the conformal liner as described in block 180, in order to produce a generally smooth surface onto which other materials can be deposited to complete formation of the FinFET and its encapsulating materials. The exposed portion of the conformal liner can include both the fences that remain from being between a target fin and the fill material, as well as the upper portion of the conformal liner that covers the sides of the unoxidized semiconductor fins in the fin array.

After the fill material and the target fins have been recessed to around the first height, and the exposed portion of the conformal liner has been removed, a residual portion of the plurality of first hardmasks can be removed from atop the plurality of semiconductor fins in the fin area, as described in block 190. The semiconductors may have a fin height that protrudes up to 70 nm above the first height (where the layer of fin material that the fin was formed from was approximately 100 nm tall). The method ends in block 199.

Figure 2:
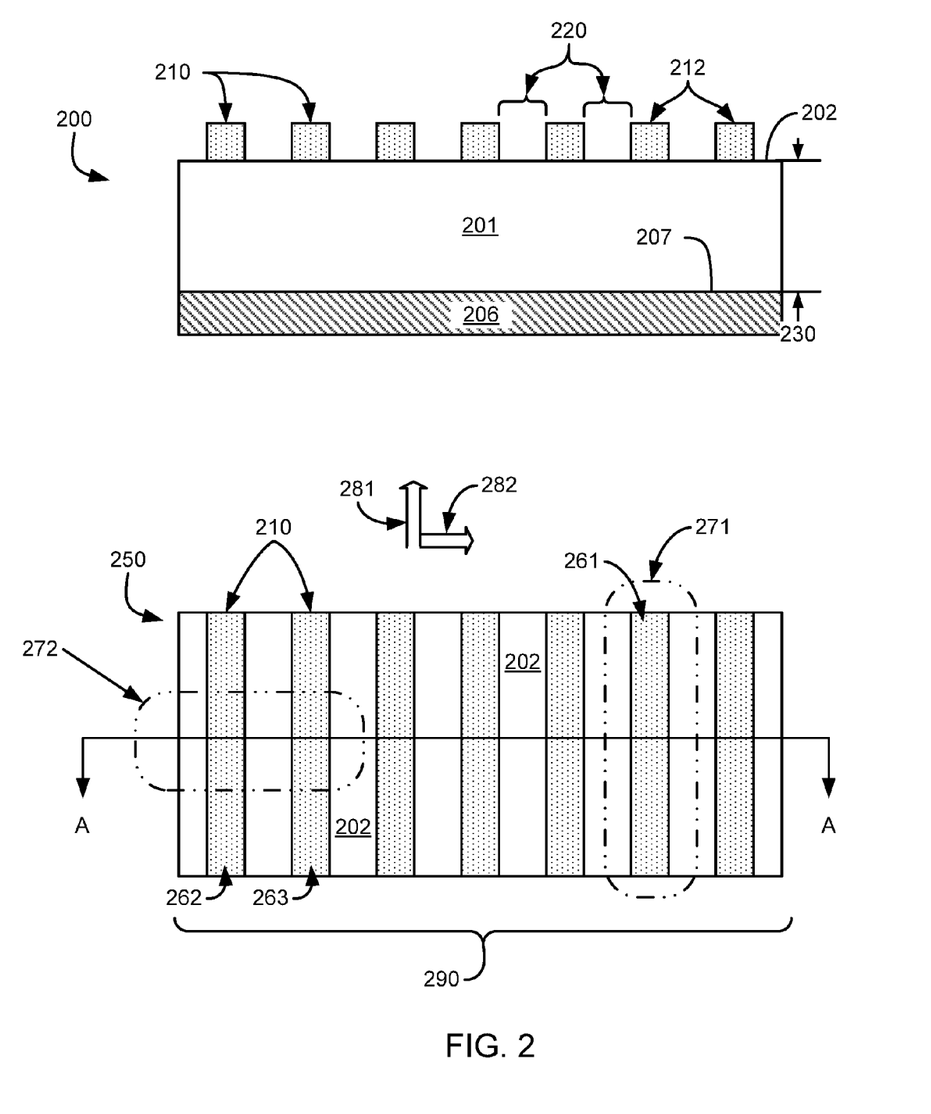
FIG. 2 depicts a cross-sectional and a top-down view of a layer of fin material with a plurality of first hardmasks on the top side of the layer of fin material, according to embodiments.

FIG. 2 depicts two views of a stack of semiconductor materials: a cross-sectional view 200 and a top-down view 250. The cross-sectional view (from the cross section A-A in top-down view 250) shows a first hardmask 210 on a first top side 202 of a layer of fin material 201. The layer of fin material may be up to approximately 100 nm thick on a substrate top side 207 of a substrate 206. The substrate may be a silicon dioxide layer found in commercially available silicon-on-insulator (SOI) wafers that are frequently used for manufacturing integrated circuit that include FinFETs.

The first hardmask 210 may have a hardmask top side 212 and at least one first hardmask opening 220 through which the first top side 202 can be accessed from above the semiconductor wafer surface. The first hardmask may be divided into a plurality of segments (or a plurality of first hardmasks), each of which defines a FinFET fin during an etch step to form a fin array.

The top-down view 250 shows the first top side 202 and the first hardmask 210. The lines of the first hardmask can run in a first direction 281 on the first top side 202. Some of the fins created by etching the layer of fin material may be target fins that will later be cut. The fins on the substrate can have a fin height approximately the same as, or less than, the thickness of the layer of fin material (up to approximately 100 nm thick).

Fins and segments of fins that are to be cut (target fins) can be selected from among a fin array 290 by applying a fin cut pattern with at least one fin cut area to a second hardmask on top of the wafer surface at a later step in the FinFET manufacturing process. The fin cut pattern may have a first fin cut area 271 that runs substantially in the first direction 281, and a second fin cut area 272 that runs largely in the second direction 282. Fin cut areas may remove long lengths of fins, such as where first fin cut area 271 overlaps the first target fin 261, as when the fin runs in the first direction 281. Small segments of target fins, such as where the second fin cut area 272 overlaps the second target fin 262 and the third target fin 263, can be cut by fin cut areas like the second fin cut area 272 that extend primarily along the second direction 282. Areas in the fin array can be created by cutting fins within fin cut arrays that run in both the first direction 281 and the second direction 282. After a fin is oxidized and cut to a first height, it can generally be shorter than the fin height. The first height, to which oxidized fin material and the fill material are approximately recessed, can be between 30 nm and 50 nm in thickness.

Figure 3:
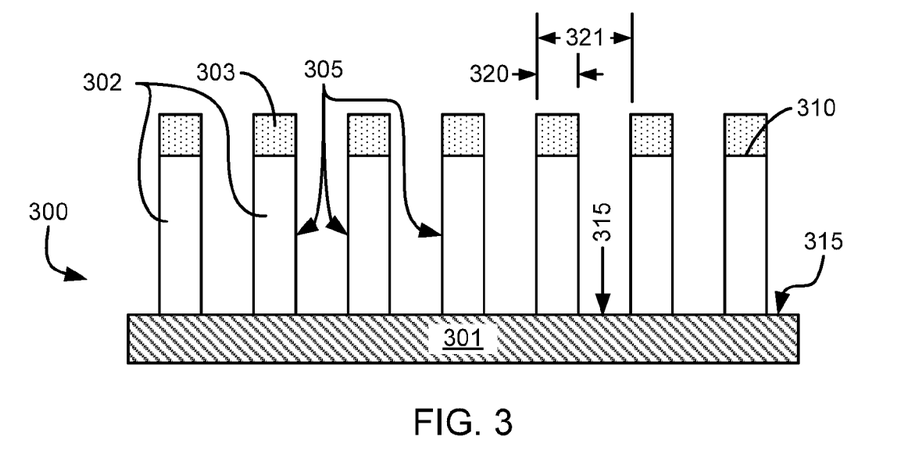
FIG. 3 depicts a cross-sectional view of fins after etching the layer of fin material, the first patterned hardmask still on the top side of the fin material and a substrate top side being revealed, according to embodiments.

FIG. 3 depicts a cross-sectional view 300 of a plurality of semiconductor fins 302 etched from the layer of fin material on a substrate 301, a first hardmask 303 still on each of the fin top sides 310 in the plurality of semiconductor fins, according to embodiments. The substrate top side 315 is exposed at the bottom of the troughs between the plurality of semiconductor fins 302. In some embodiments, the fins in the plurality of semiconductor fins can have a fin width between 5 nm and 10 nm. The combination of the fin width 320 and the width of the trough equals, in embodiments, the fin pitch 321. The fin width and the fin pitch may vary in different areas of a fin array, and may vary from one fin array to another on a semiconductor wafer, according to the design parameters of the integrated circuit that is being made. For example, fins of negatively doped FinFETs may have a different fin size than positively doped FinFETs because of the electrical properties of the materials they are made of. The plurality of semiconductor fins 302 may have a plurality of semiconductor fin sides 305 onto which materials can be deposited. Examples of such materials may include spacers, liners within the trough, and fill materials that fill the troughs to provide structural stability to the plurality of semiconductor fins 302.

Figure 4:
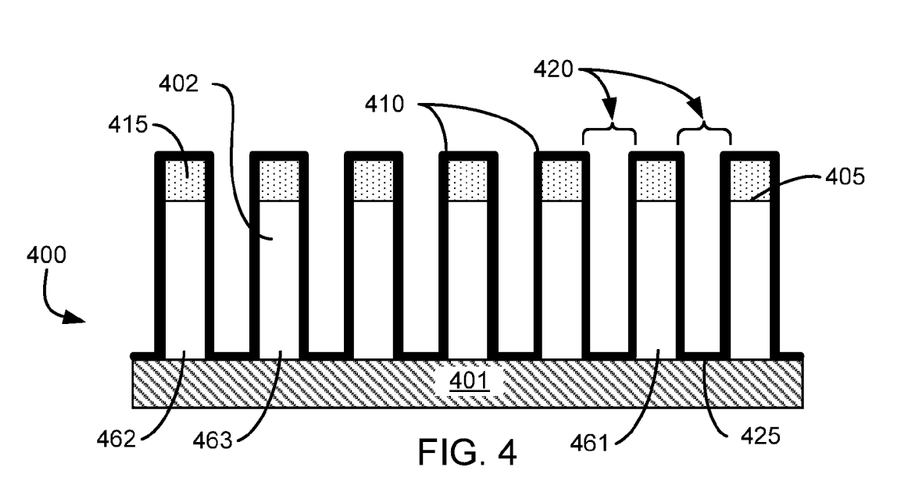
FIG. 4 depicts a cross-sectional view of a conformal liner that has been deposited on a plurality of semiconductor fins, a first hardmask, and a substrate, according to embodiments.

FIG. 4 depicts a cross-sectional view 400 of a conformal liner 410 that has been deposited on a plurality of semiconductor fins 402. According to embodiments, the conformal liner can also be deposited on the substrate top side 425. Some embodiments may include a first hardmask 415 on the fin top side 405 of the plurality of semiconductor fins 402. In such embodiments, the conformal liner 410 can also be deposited on the sides and top of the first hardmask on each semiconductor fin in the plurality of semiconductor fins. The conformal liner 410 can thus line the substrate 401 within each of the plurality of troughs 420 between the semiconductor fins. The conformal liner may be a nitride material such as silicon nitride $Si_3N_4$ or silicon oxy-nitride, in some embodiments. A dielectric material can later be deposited onto the conformal liner 410 in each of the plurality of troughs 420 in order to provide structural support for, and electrical insulation between lower parts of the semiconductor fins.

The plurality of semiconductor fins 402 can include target fins such as target fins 461, 462, and 463. The conformal liner 410 can protect the plurality of semiconductor fins 402 that are not target fins during the process of cutting target fins by converting them from semiconductor fin material into dielectric material. Once the target fins have been oxidized, the residual portion of the plurality of semiconductor fins can be uncovered and incorporated into FinFETs in an integrated circuit.

Figure 5:
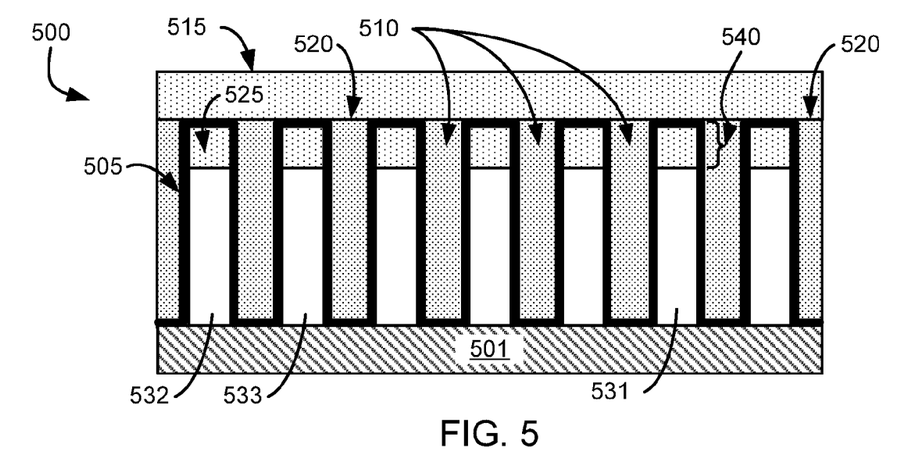
FIG. 5 depicts a cross-sectional view of a fill material that has been deposited into a plurality of troughs between semiconductor fins in the fin array, and of a second hardmask material on the fill material top side, according to embodiments.

FIG. 5 depicts a cross-sectional view 500 of a fill material 510 that has been deposited into a plurality of troughs between semiconductor fins in the fin array, and of a second hardmask material 515 on the fill material top side 520, according to embodiments. The fill material can be an oxide such as silicon dioxide, in various embodiments, although other fill materials may be used without adverse effects on the fin structure or FinFET being constructed on the semiconductor wafer. According to embodiments, a conformal liner 505 may be on the substrate 501 and on the sides and on top of the semiconductor fins in the fin array. Some embodiments may also have a first hardmask 525 on the fin top side, where an upper portion 540 of the conformal liner 505 extends from the sides of the semiconductor fins to sides and top of the first hardmask 525. The upper portion 540 of the conformal liner that protects the first hardmask can be removed in subsequent processing steps as part of the cutting process to transform the target fins into dielectric fins. A plurality of target fins 531, 532, and 533 are identified in the fin array for cutting later in the manufacturing process.

Figure 6:
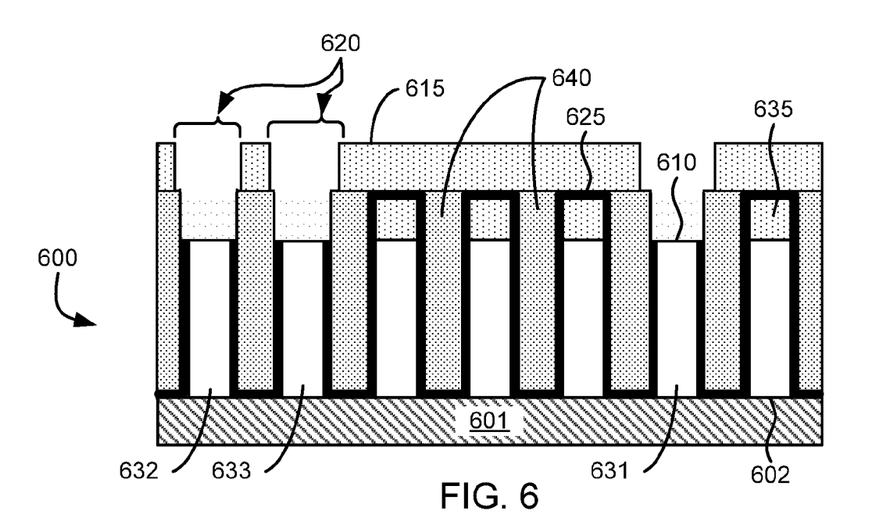
FIG. 6 depicts a cross-sectional view of target fins that have been exposed after etching a fin cut pattern into the patterned hardmask, according to embodiments.

FIG. 6 depicts a cross-sectional view 600 of target fins that are accessible after etching a fin cut pattern into the second hardmask 615 and exposing the tops of the target fins, according to embodiments. A substrate 601 can have a plurality of semiconductor fins, including target fins 631, 632, and 633 on the substrate top side 602. A conformal liner 625 can cover the substrate top side 602 at the bottom of troughs between the plurality of semiconductor fins and can extend up the sides of the semiconductor fins. In some embodiments not shown in FIG. 6, the conformal liner 625 covers the semiconductor fin sides and the fin top side 610. Some embodiments similar to that shown in FIG. 6 can have a first hardmask on the fin top side 610 with the conformal liner 625 covering the sides of the semiconductor fins and the sides and the top of the first hardmask on the fin top side.

The second hardmask 615 can be patterned by etching second hardmask openings 620 into the second hardmask, the second hardmask openings 620 being above target fins that are to be cut from the fin array. The upper portion of the conformal liner 625 can be etched away in areas exposed by the second hardmask openings 620 in order to expose the fin top side 610, according to embodiments. In embodiments where there is a first hardmask 635, exposing fin top side 610 can also include removing the first hardmask 635 from the fin top side. The conformal liner 625 between the first hardmask 635 and the fill material 640 may also be removed. In embodiments (not shown) where there is no first hardmask, but where the conformal liner is on the fin top side, the removing the upper portion of the conformal liner 625 may suffice to expose the fin top side prior to dopant implantation.

Figure 7:
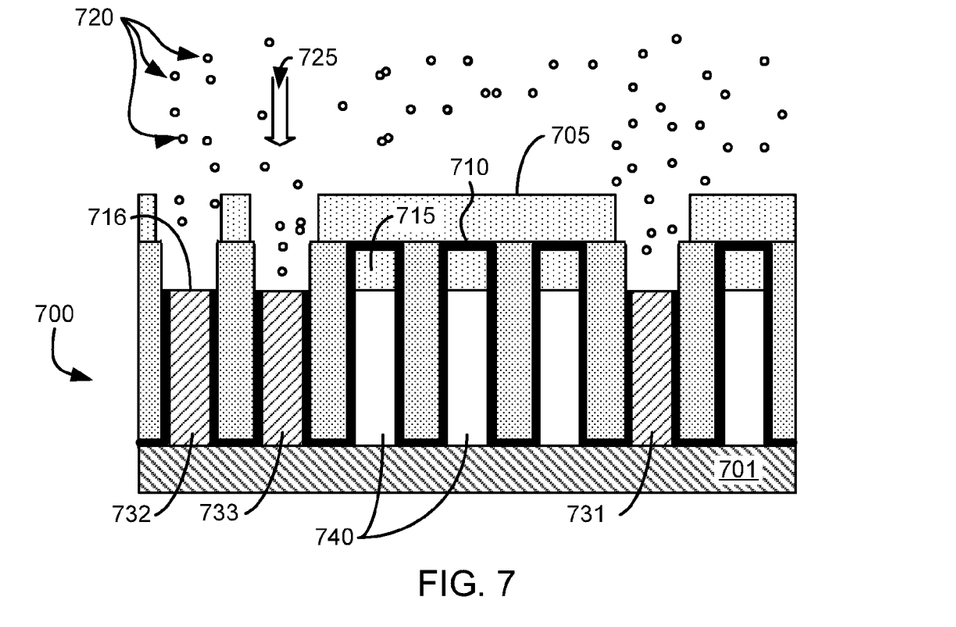
FIG. 7 shows a cross-sectional view of target fins that have been implanted with a dopant to promote oxidation of the target fins, according to embodiments.

FIG. 7 shows a cross-sectional view 700 of target fins that have been implanted with a dopant 720 to promote oxidation of the target fins, according to embodiments. A substrate 701 may have a plurality of semiconductor fins on the substrate top side. Among the plurality of semiconductor fins may be target fins 731, 732, and 733. The target fins may each have an exposed fin top side 716 where the conformal liner 710 and first hardmask 715 have been removed.

The fin top side 716 on each of the target fins may be exposed to allow dopant 720 such as phosphorus or arsenic atoms, or some other dopant that can promote oxidation of the semiconductor fin material, to be implanted into the target fins along an implantation direction 725 that is perpendicular, or approximately perpendicular, to the fin top side 716). Dopants can be deposited into semiconductor fin material such as silicon or silicon germanium alloys. Implanting dopants into semiconductor fin material can facilitate oxidation (such as steam oxidation) of the semiconductor fin material to form a dielectric material out of the target fin. While first, second and third target fins 731, 732, and 733 have exposed fin top sides and can be implanted with phosphorus, the plurality of protected semiconductor fins 740, where the second hardmask 705, the conformal liner 710, and, in embodiments where the first hardmask 715 is present, the first hardmask, block implantation of the dopant 720 into the plurality of protected semiconductor fins 740.

Figure 8:
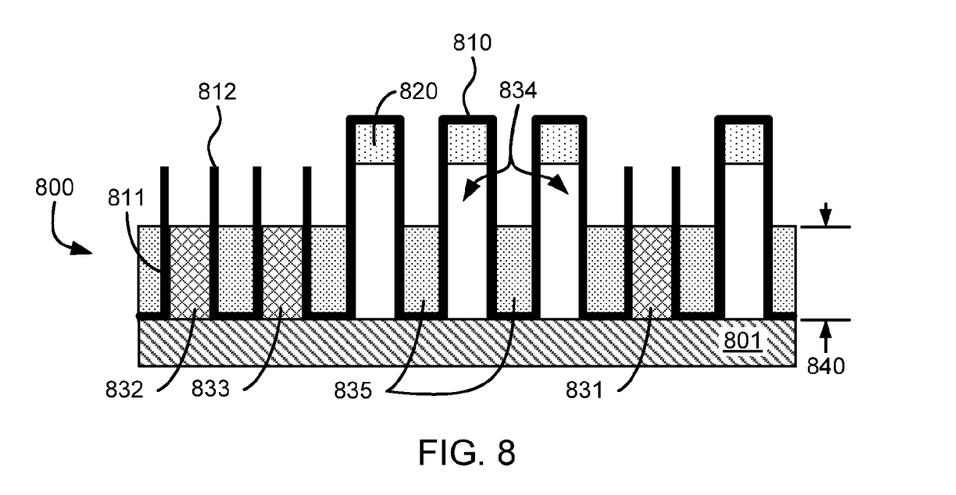
FIG. 8 shows a cross-sectional view of target fins that have been oxidized after the second patterned hardmask has been removed and the fill material has been recessed, according to embodiments.

FIG. 8 shows a cross-sectional view 800 of target fins that have been oxidized after the second patterned hardmask has been removed and the fill material has been recessed, according to embodiments. The substrate 801 has a residual portion 834 of the plurality of semiconductor fins on the substrate top side. A conformal liner 810 covers the substrate top side between the plurality of semiconductor fins and covers the semiconductor fins by extending up the sides of the semiconductor fins and over the fin top sides. In embodiments where a first hardmask is present on the fin top sides, as in cross-sectional view 800, the conformal liner 810 can cover the sides and top of the first hardmask 820 on each semiconductor fin.

Cross-sectional view 800 shows the target fins, where first target fin 831, second target fin 832, and third target fin 832 have been converted from implanted target fins (such as fins 731, 732, and 733 in FIG. 7) to oxidized target fins (or, dielectric fins). Oxidizing target fins can occur by processing implanted semiconductor fins in an atmosphere of water vapor and oxygen at elevated temperatures, in a processing chamber such as a rapid thermal processing furnace. Exposing a semiconductor wafer with implanted target fins to elevated temperatures (e.g., between 600 degrees Celsius and 1000 degrees Celsius) for extended periods (such as periods of up to one hour in length) can achieve oxidation of implanted semiconductor fins to convert them into dielectric fins that cannot conduct electrical current. The dielectric material of the dielectric fins may include phosphorus- or arsenic-doped oxides such as silicon dioxide, mixtures of silicon dioxide and germanium dioxide, or mixtures of other oxides that can be produced from semiconducting materials used in the formation of fins for FinFETs.

Oxidizing the implanted semiconductor fins, as described previously in FIG. 7, can occur after implantation. In embodiments, the second hardmask can be removed and the fill material 835 and the target fins 831, 832, and 833, can be recessed. The process of removing the fill material can follow the removal of the second hardmask in order to recess the fill material between protected semiconductor fins at the same time that fill material between target fins. By recessing all of the fill material in a fin array down to the first height 840 at the same time, a more uniform wafer surface can be created.

Recessing fill material 835 and dielectric fin material in target fins 831, 832, and 833, can occur in separate steps if the fill material and the dielectric fin material are responsive to etching by different chemistries. According to some embodiments, the target fins (after oxidation) 831, 832, and 833, can be doped silicon dioxide or mixtures of doped silicon dioxide and germanium dioxide, while the fill material may be undoped or lightly doped dielectric material. In some contexts, the oxidized target fin can be called a dielectric fin even in embodiments where a top part of the target fin has been oxidized to form dielectric material and a bottom part of the target fin remains semiconductor material.

In embodiments where the fill material and the dielectric material of the target fin are responsive to etching under similar conditions, recessing the fill material and the oxidized target fins can proceed in a single step once the second hardmask has been removed. According to embodiments, the dopant level in the fill material 835 and in the oxidized target fins 831, 832, and 833 may vary according to the concentration of dopant in each of the materials. The concentration of dopant in a target fin that can facilitate oxidation can be readily ascertained by practitioners using published references.

Recessing the fill material 835 and the material of the oxidized target fins to a first height 840 may not proceed at the same rate for each material, but both materials can be recessed to approximately the first height 840 in order to provide a smooth surface for future processing steps. According to various embodiments, the first height 840 can be at least 30 nm above the substrate top side, and may be as much as 50 nm in some cases. The fin height of the plurality of semiconductor fins that were protected by at least the second hardmask may be as much as approximately 100 nm in certain embodiments, making the fin height at least two times greater than the first height (once the fill material and target fin have been recessed).

After recessing the fill material 835 and the target fins 831, 832, and 833, to the approximately the first height 840, a fence 812 of conformal liner material may remain behind between the fill material and the target fins. The fence 812 can be an unsupported piece of conformal liner material that protrudes above the first height 840, while a buried portion 811 of conformal liner material may extend between the fill material 835 and the target fins below the first height 840. An exposed portion of the conformal liner 810 that covers the residual portion 834 of the plurality of semiconductor fins and any first hardmask 820 on the fin top sides may be removed along with each fence 812 using wet etch or plasma etch processing steps, according to techniques known to practitioners.

Figure 9:
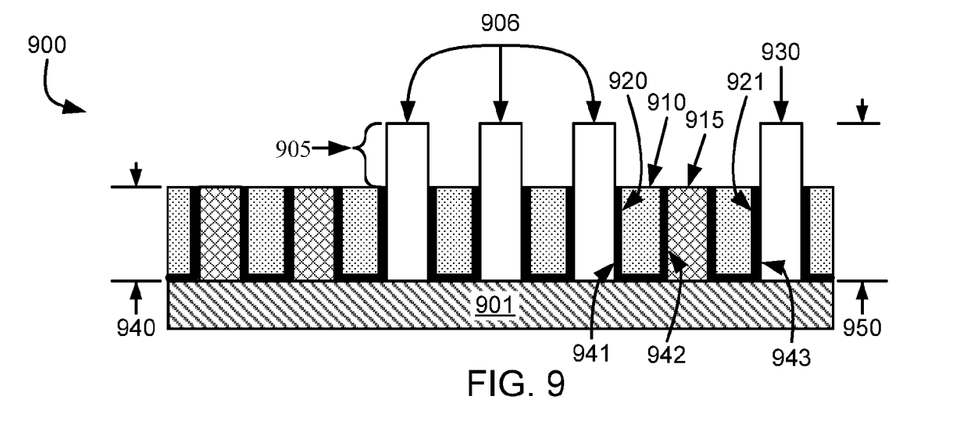
FIG. 9 shows a cross-sectional view of target fins and an exposed portion of the conformal liner (above the first height), according to embodiments.

FIG. 9 shows a cross-sectional view 900 of a residual portion 906 of the plurality of semiconductor fins on a substrate 901 after the target fins have been cut and an exposed portion the conformal liner has been removed. A conformal liner 920 may cover parts of the substrate 901 and extend up to a first height 940 (or, the dielectric fin height) between the fill material 910 and a target fin 915. The conformal liner 920 (or a first conformal liner segment) can be on a semiconductor fin (a first side 941 of the semiconductor fin) and on a second side 942 of a target fin 915 up to the first height. In some embodiments, a second conformal liner 921 (or second conformal liner segment) can cover a third side of the target fin 915 and a fourth side 943 of a second semiconductor fin 930, with fill material on top of the second conformal liner 921 up to the first height 940. A protruding portion 905 of each semiconductor fin in the residual portion 906 can extend as much as 80 nm (in some embodiments) above the first height 940 up to a fin height 950 of approximately 100 nm. The protruding portion 905 can eventually make electrical contact with a source, a drain, or a gate structure in a FinFET in an integrated circuit. The target fin 915 in the fin area is prevented from making electrical contact with the source, the drain, or the gate structure in a FinFET because at least the top portion of the target fin has been converted to dielectric material by the oxidizing step. In some embodiments, more than the top portion or all of the target fin can be converted into dielectric material.

Figure 10:
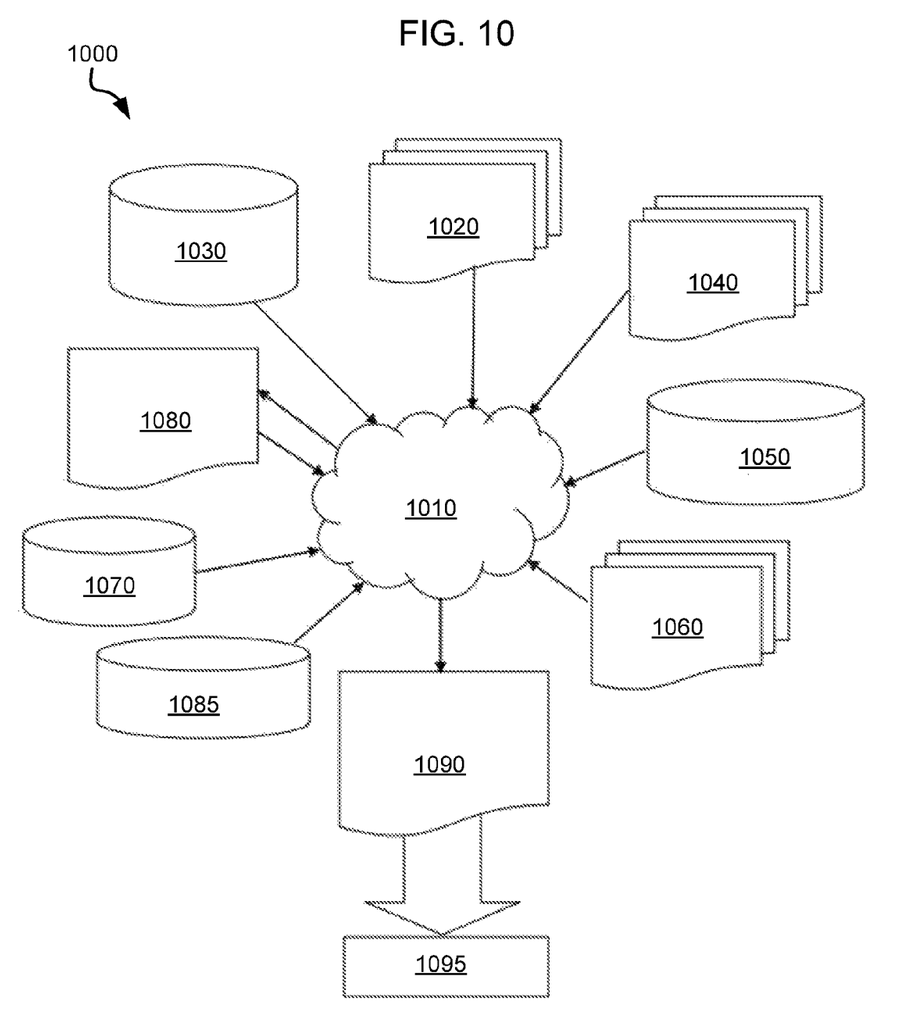
FIG. 10 shows a flow diagram of a design process used in semiconductor design, manufacture, and/or test.

FIG. 10 shows a block diagram of an exemplary design flow 1000 used for example, in semiconductor IC logic design, simulation, test, layout, and manufacture. Design flow 1000 includes processes, machines and/or mechanisms for processing design structures or devices to generate logically or otherwise functionally equivalent representations of the design structures and/or devices described above and shown in FIGS. 2 through 9. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIGS. 2 through 9. As such, design structure 1020 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures shown in FIGS. 2 through 9 to generate a Netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which Netlist 1080 is resynthesized one or more times depending on design specifications and parameters for the device. As with other design structure types described herein, Netlist 1080 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including Netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1020 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments shown in FIGS. 2 through 9. In one embodiment, design structure 1090 may comprise a compiled, executable HDL simulation model that functionally simulates the devices shown in FIGS. 2 through 9.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2 through 9. Design structure 1090 may then proceed to a stage 1095 where, for example, design structure 1090: proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a fin array on a substrate and having a first semiconductor fin with a semiconductor fin height and a first side;
   a dielectric fin having a dielectric fin height and a second side facing the first side, the dielectric fin extending in a first direction substantially parallel to the first semiconductor fin;
   a first conformal liner lining a first trough, the first conformal liner extending across the substrate between the first side and the second side and up to approximately the dielectric fin height on the first side and on the second side; and
   a fill material filling the first trough up to approximately the dielectric fin height.

2. The semiconductor device of claim 1, further comprising:
   a second conformal liner lining a second trough between the dielectric fin and a second semiconductor fin, the dielectric fin having a third side and the second semiconductor fin having a fourth side, the third side facing the fourth side, the second conformal liner extending across the substrate and up both the third side and the fourth side to approximately the dielectric fin height; and
   the fill material filling the second trough to approximately the dielectric fin height.

3. A design structure readable by a machine used in design, manufacture, or simulation of an integrated circuit, the design structure comprising:
   a fin array on a substrate and having a first semiconductor fin with a semiconductor fin height and a first side;
   a dielectric fin having a dielectric fin height and a second side facing the first side, the dielectric fin extending in a first direction substantially parallel to the first semiconductor fin;
   a first conformal liner lining a first trough, the first conformal liner extending across the substrate between the first side and the second side and up to approximately the dielectric fin height on the first side and on the second side; and
   a fill material filling the first trough to approximately the dielectric fin height.

4. The design structure of claim 3, wherein the design structure comprises a Netlist.

5. The design structure of claim 3, wherein the design structure resides on storage medium as a data format used for the exchange of layout date of integrated circuits.

6. The design structure of claim 3, wherein the design structure resides in a programmable gate array.

* * * * *